(12) United States Patent
Barrett et al.

(10) Patent No.: US 10,014,678 B2
(45) Date of Patent: Jul. 3, 2018

(54) SUBSEA SCREEN CONNECTION ASSEMBLY

(71) Applicant: Siemens Aktiengesellschaft, Munich (DE)

(72) Inventors: Wesley Barrett, Kendal (GB); Neil Knight, Barrow-in-Furness (GB); Thierry Tioffo, Ulverston (GB)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/298,502

(22) Filed: Oct. 20, 2016

(65) Prior Publication Data

US 2017/0125994 A1    May 4, 2017

(30) Foreign Application Priority Data

Nov. 4, 2015 (EP) .................................... 15193008

(51) Int. Cl.
    *H01R 4/66* (2006.01)
    *H01R 13/648* (2006.01)
    *H02G 15/013* (2006.01)
    *H05K 9/00* (2006.01)
    *H02G 9/00* (2006.01)
    *H01R 13/6592* (2011.01)
    (Continued)

(52) U.S. Cl.
    CPC ......... *H02G 15/013* (2013.01); *H01R 13/523* (2013.01); *H01R 13/5205* (2013.01); *H01R 13/6592* (2013.01); *H02G 9/00* (2013.01); *H05K 9/0064* (2013.01)

(58) Field of Classification Search
    CPC ............................. H01R 12/596; H01R 9/032; H01R 13/65802; H01R 13/652; H02G 15/013; H05K 9/0064

USPC ................................................ 439/95, 98, 99
See application file for complete search history.

(56) References Cited

U.S. PATENT DOCUMENTS 2,112,053 A    3/1938 Thomas, Jr.
4,080,024 A *  3/1978 Kroon .................... H01R 4/646
                                                             174/78

(Continued)

FOREIGN PATENT DOCUMENTS

EP    0549942 A2    7/1993
EP    2665138 A2    11/2013

OTHER PUBLICATIONS

EP Search Report dated Mar. 30, 2017, for EP patent application No. 16194895.5.

*Primary Examiner* — Hae Moon Hyeon
(74) *Attorney, Agent, or Firm* — Beusse Wolter Sanks & Maire

(57) ABSTRACT

A subsea screen connection assembly configured to electrically couple a subsea cable having an earth screen, the earth screen at least partially surrounding a cable core, to a subsea device. The subsea connection assembly has a connector body configured to be electrically connected to the subsea device and a clamping element configured to at least partially surround the earth screen of the subsea cable in a circumferential direction and to apply a clamping force in a radial direction to the at least partially surrounded earth screen of the subsea cable, the inner diameter of the clamping element being adjustable, and the clamping element configured to electrically connect the earth screen to the connector body.

17 Claims, 5 Drawing Sheets

(51) Int. Cl.
*H01R 13/523* (2006.01)
*H01R 13/52* (2006.01)

(56) References Cited

U.S. PATENT DOCUMENTS

| | | | | |
|---|---|---|---|---|
| 4,257,658 | A * | 3/1981 | Hammond | H01R 4/646 |
| | | | | 174/78 |
| 4,790,765 | A * | 12/1988 | Ehrenfels | H01R 9/037 |
| | | | | 439/799 |
| 6,262,374 | B1 | 7/2001 | Matsumoto et al. | |
| 6,537,104 | B1 | 3/2003 | Hagmann et al. | |
| 6,558,172 | B2 * | 5/2003 | Kanagawa | H01R 9/0524 |
| | | | | 439/582 |
| 6,793,532 | B2 * | 9/2004 | Saito | H01R 9/032 |
| | | | | 174/360 |
| 8,734,026 | B2 * | 5/2014 | Nagengast | E21B 33/0385 |
| | | | | 385/147 |
| 8,777,643 | B2 * | 7/2014 | De France | H01R 9/0524 |
| | | | | 174/78 |
| 8,841,562 | B2 | 9/2014 | Drotleff et al. | |
| 2010/0227483 | A1 * | 9/2010 | Vernica | H01R 4/36 |
| | | | | 439/98 |
| 2011/0155459 | A1 | 6/2011 | Nicholson et al. | |
| 2016/0365675 | A1 * | 12/2016 | Atkinson | H01R 4/4881 |

\* cited by examiner

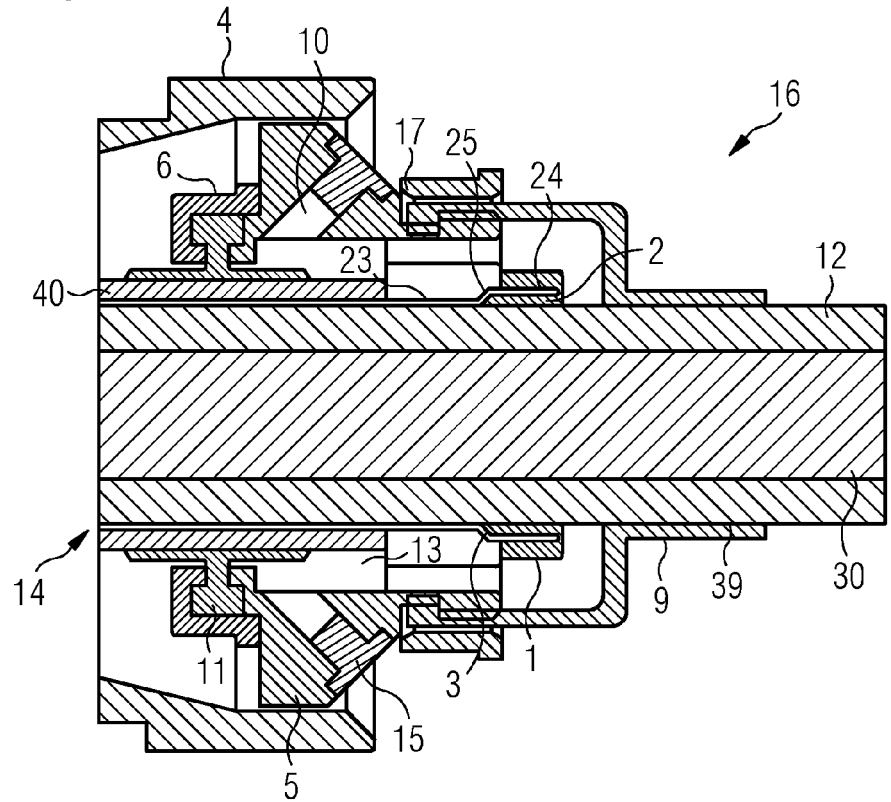
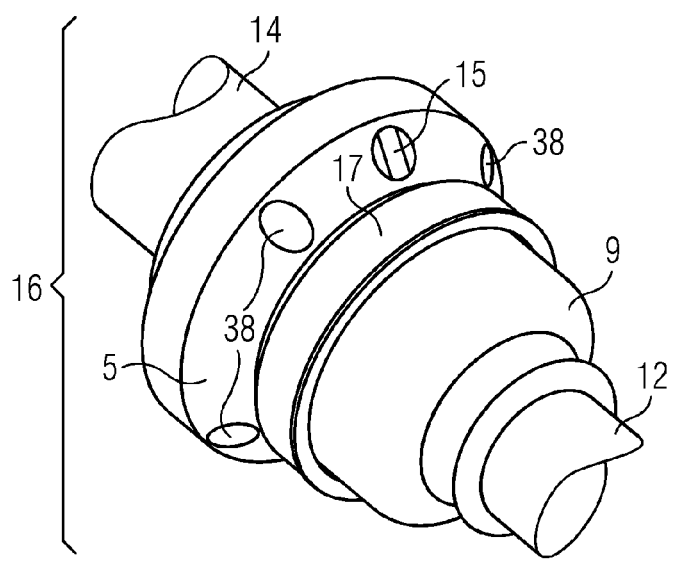

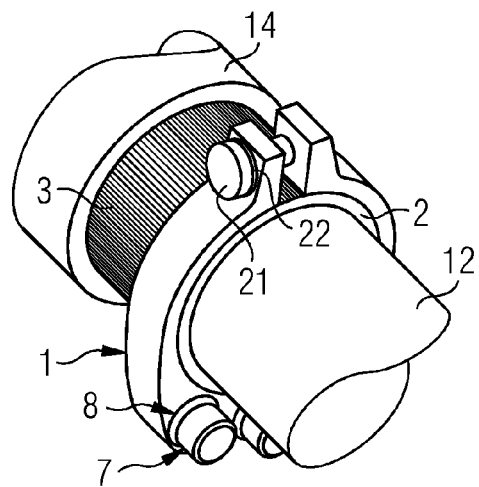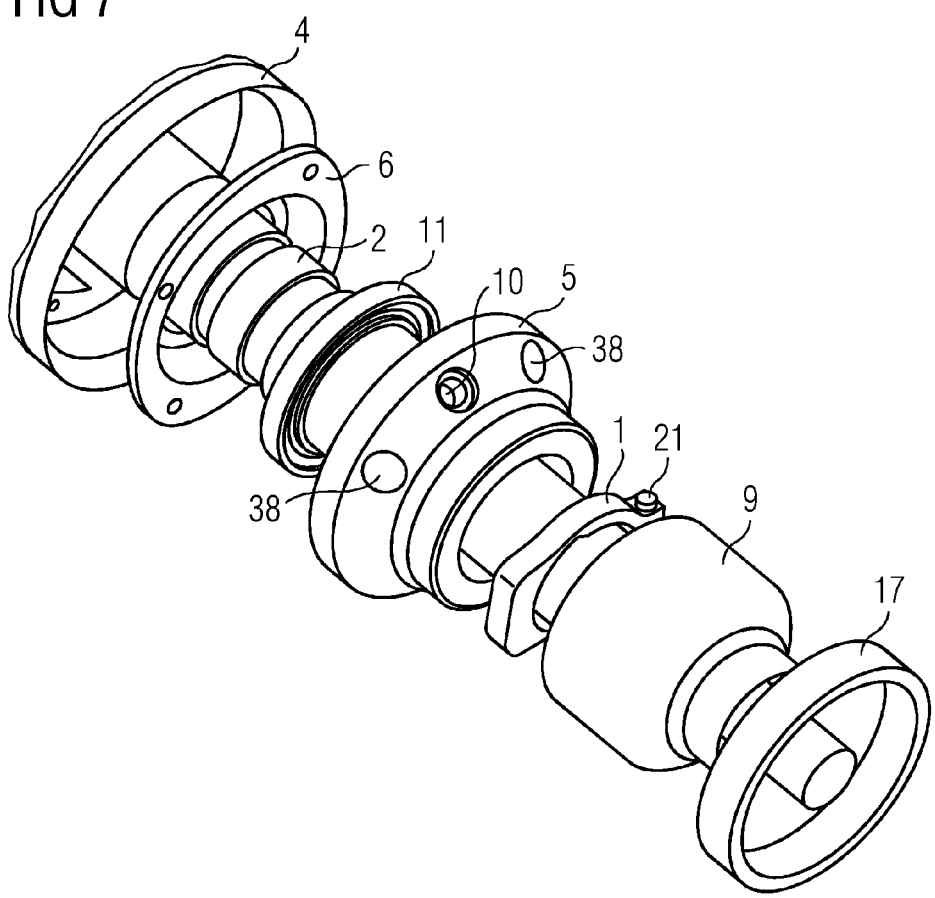

SUBSEA SCREEN CONNECTION ASSEMBLY

CROSS REFERENCE TO RELATED APPLICATIONS

This application claims the benefit of European Application No. EP15193008 filed 4 Nov. 2015, incorporated by reference herein in its entirety.

FIELD OF INVENTION

The present invention relates to a subsea screen connection assembly of a subsea connector or a subsea penetrator arrangement for coupling an earth screen of a subsea cable to a subsea device or equipment.

BACKGROUND OF THE INVENTION

In subsea applications, for example, subsea oil production, subsea electrical connectors and penetrators typically provide a connection to the screen or earth of a cable running within an electrical conduit or jumper. Conventionally, the earth connection between a housing of a penetrator or connector and an earth screen of a subsea cable has been of a small cross-sectional area due to circulating earth screen currents being of negligible value because of the lower operating frequencies and currents of applications to date.

FIG. 1 shows an exemplary earth connection between an earth screen 3 of a subsea power cable 14 and a connector or penetrator housing 4. The earth screen 3 of the subsea cable 14 surrounds an inner layer 12, for example, an isolating or semi-conductive material in which one or more core wires are embedded. For example, an earth wire 18 may be soldered to the cable earth screen 3 and attached internally to the connector or penetrator housing at, for example, an earth sleeve 19. An outer boot 20 may surround this termination to prevent water ingress. This kind of earth screen termination is a complex, time-consuming, and highly skilled process. Due to the earth wire 18 having to be routed within the connector or penetrator to be attached to the housing and due to the lack of available space, the earth wire 18 has typically been of small cross-sectional area. Furthermore, the soldering operation may introduce a risk of de-soldering and loss of the earth screen connection at higher temperatures which can be created by a circulating earth screen current and high resistance of the small cross-sectional area of the earth wire 18. Additionally, with the increasing power requirements on more recent and future subsea developments, a main conductor current and frequency may increase, resulting in larger circulating earth screen currents in the earth screen of the subsea cable and consequently between the connector or penetrator housing and the earth screen of the subsea cable. Due to the relatively small cross-section of the earth wire 18, this may result in unwanted higher operating temperatures due to power losses caused by the relatively high resistance of the earth wire 18. Recent specifications relating to subsea high voltage connectors and penetrators have, for example, stipulated that the connecting earth wire must be a minimum of 6 $mm^2$, but should preferably match the cross-sectional area of the earth screen in the subsea cable. Further difficulties may arise by the fact that the earth screen termination has to be sealed and capable of withstanding operational depth pressures of up to 3.000 m in a flooded scenario.

Therefore, there is a need for reliable earth screen connections which provide a low resistance and which can be easily installed and sealed.

SUMMARY OF THE INVENTION

According to the present invention, an object is achieved by a subsea screen connection assembly, a subsea connector and a subsea penetrator arrangement as defined in the independent claims. The dependent claims define advantageous embodiments of the present invention.

According to an aspect of the present invention, a subsea screen connection assembly is provided which is configured to electrically couple a subsea cable comprising an earth screen, the earth screen at least partially surrounding a cable core, to a subsea device, for example, a subsea connector or a subsea penetrator. The subsea screen connection assembly comprises a connector body configured to be electrically connected to the subsea device and a clamping element. The clamping element is configured to at least partially surround the earth screen of the subsea cable in a circumferential direction. Furthermore, the clamping element is configured to apply a clamping force in a radial direction to the at least partially surrounded earth screen of the subsea cable, the inner diameter of the clamping element being adjustable. The clamping element further comprises a coupling configured to electrically connect the earth screen to the connector body. The connector body and the clamping element may be made at least partially of an electrically conductive material.

Therefore, when the connector body is connected to the subsea device, an electrical connection from the full cross sectional area of the earth screen of the subsea cable may be realized to the subsea device via the clamping element and the connector body. Consequently, an earth wire 18 as shown in FIG. 1 is not needed anymore and the complex and time-consuming soldering process may be avoided and is replaced by a more reliable clamping mechanism which improves an electrical performance of a subsea connector or subsea penetrator arrangement at higher current levels by carrying the full earth screen cross-sectional area to a housing of the connector or penetrator. This allows higher circulating earth screen currents as the power losses are significantly lower resulting in lower operating temperatures. Additionally, the clamping mechanism is a more reliable connection method than soldering and eliminates the risk for disconnection due to de-soldering or a high resistance soldered joint. Furthermore, the need for a bulky connection wire between the earth screen of the subsea cable and the housing of the connector or penetrator is avoided as the clamping mechanism is directly connected to the connector body which may be directly connected to the housing of the connector or penetrator. Due to the clamping element, the subsea screen connection assembly may work with all types of cable screens including copper wire, braids, tape and foil wraps. The clamping mechanism has advantages over other types of connection, such as crimp connectors, in that it can be easily removed and reused, without the need for new components each time.

In an embodiment, the subsea screen connection assembly comprises a collar which is configured such that its inner circumferential surface mates to an outer circumferential surface of an inner layer of the subsea cable. The inner layer of the subsea cable is a layer which is surrounded by the earth screen of the subsea cable. The inner layer of the subsea cable may comprise, for example, an isolating or semi-conductive layer surrounding a bedding in which one or more core wires of the subsea cable are embedded. The expression "the inner circumferential surface mates to the outer circumferential surface" may imply that a diameter of the inner circumferential surface of the collar is larger than a diameter of the outer circumferential surface of the inner layer of the subsea cable such that a contact between the collar and the inner layer is avoided or reduced. For example, the collar may be configured such that an annular clearance may exist between the inner circumferential surface of the collar and the outer circumferential surface of the inner layer. The annular clearance may have a width in a range of 0.01 to 5 mm, advantageously 0.1 to 1 mm.

The collar may be arranged or located between the earth screen of the subsea cable and the inner layer of the subsea cable. In other words, the collar may be sandwiched between the earth screen of the subsea cable and the inner layer of the subsea cable.

The collar may be furthermore located such that it is at least partially surrounded by the clamping element. In other words, the earth screen of the subsea cable may be arranged sandwiched between the collar and the clamping element.

As described above, the clamping element is configured to apply a clamping force in a radial direction to the at least partially surrounded screen of the subsea cable. In combination with the collar located as described above, the clamping element applies a clamping force in a radial direction to the earth screen and presses the earth screen against the collar. However, due to the circular form of the collar, the collar may withstand large forces in a radial direction without being deformed. Therefore, a high radial force applied from the clamping element may be exerted via the earth screen to the collar without having an impact on the inner layer. Clamping the earth screen between the collar and the clamping element may contribute to fix the position of the subsea cable in the longitudinal direction within the subsea screen connection assembly. The earth screen is considerably pressed between the clamping element and the collar such that an electrical contact area having a large cross-sectional area may be provided between the clamping element and the earth screen of the subsea cable. This may contribute to a low resistance of the subsea screen connection assembly.

For arranging the collar between the earth screen of the subsea cable and the inner layer of the subsea cable, a diameter of the earth screen of the subsea cable may be enlarged at the location where the collar is to be arranged. Therefore, according to an embodiment, the earth screen comprises a first portion having a first inner diameter mating to the outer diameter of the inner layer of the subsea cable, and a second portion having a second inner diameter larger than the first inner diameter and mating to an outer diameter of the collar. A third portion of the earth screen connects the first and the second portions. By enlarging the diameter of the earth screen in the second portion, the collar can be arranged sandwiched between the inner layer of the subsea cable and the earth screen of the subsea cable without influencing the inner layer of the subsea cable. The clamping element may be arranged in the area of the second portion and may apply a radial force onto the second portion of the earth screen.

In another embodiment, the connector body comprises a receptacle through which the subsea cable is passed to enter the subsea device. The connector body includes a filling opening which is in a fluid communication with the receptacle. An elastomeric encapsulant may be filled into the receptacle via the filling opening. The elastomeric encapsulant may seal the subsea cable within the receptacle.

Furthermore, the subsea screen connection assembly may comprise a boot coupled in a fluid-tight connection to the connector body. The boot has an opening configured such that the subsea cable can be passed through the opening. Furthermore, the boot may be arranged such that the clamping element is arranged between the fluid-tight connection to the connector body and the opening. Therefore, the clamping element may be enclosed by the boot.

When filling the elastomeric encapsulant via the filling opening into the receptacle, the elastomeric encapsulant may also enter the inside of the boot such that the area of the subsea screen connection assembly is completely sealed by the elastomeric encapsulant.

Furthermore, a ring may be provided which presses the boot at least partially on the connector body for reliably connecting the boot to the connector body.

According to another embodiment, the connector body comprises a seal which is arranged at an inner circumferential surface of the receptacle. The seal is configured to provide a sealing between the connector body and an outer circumferential surface of the subsea cable. Therefore, the seal may provide a further sealing barrier. Additionally, the seal may delimit a filling area for the elastomeric encapsulant when filling the elastomeric encapsulant into the receptacle.

In another embodiment, the connector body is composed of at least a first connector body part and a second connector body part. The seal is arranged between the first connector body part and the second connector body part. The first and second connector body parts may be coupled to each other by bolts such that the seal is pressed between the first and second connector body parts and additionally against an outer circumferential surface of the subsea cable when the first and second connector body parts are pressed against each other. The first connector body part may be configured to be coupled to the subsea device and a second connector body part is coupled to the clamping element. When the first connector body part is sealingly coupled to the subsea device, a reliable sealing of the subsea cable entering the subsea device may be provided.

In a further embodiment, the coupling of the subsea screen connection assembly comprises a bolt whereby the clamping element is coupled to the connector body via the bolt. Furthermore, a washer may be provided which is arranged between the clamping element and a bolt head of the bolt. Thus, a reliable mounting of the clamping element at the connector body with a low electrical resistance may be realized.

In another embodiment of the subsea screen connection assembly, an interior of the boot is in fluid communication to the receptacle. The seal and boot are configured to communicate an external pressure to the encapsulant within the connection assembly creating a pressure balanced system. Thus, the encapsulant may flow into the interior of the boot as well as into the receptacle. The seal and boot may be made of an elastic material such that they provide a sufficient elasticity to forward an external pressure to the encapsulant. This balances the pressure inside and outside of the boot and the pressure inside and outside of the seal. Therefore, a physical stress on the seal and the boot may be reduced.

According to another aspect of the present invention, a subsea connector for electrically coupling a subsea cable to subsea equipment is provided. The subsea connector comprises a housing, an electrical contact, and a subsea screen connection assembly. The electrical contact may be coupled to a cable core of the subsea cable. When the subsea connector is coupled to another mating subsea connector, the electrical contact may be engaged with a mating electrical contact of the further subsea connector. The subsea screen connection assembly is configured to electrically couple the subsea cable comprising an earth screen of the subsea cable to the subsea connector, in particular to the housing of the subsea connector. The subsea screen connection assembly comprises a connector body configured to be electrically connected to the subsea connector, and a clamping element configured to at least partially surround the earth screen of the subsea cable in a circumferential direction and to apply a clamping force in a radial direction to the at least partially surrounded earth screen of the subsea cable, the inner diameter of the clamping element being adjustable. The clamping element further comprises a coupling configured to electrically connect the earth screen of the subsea cable to the connector body. Thus, a reliable electrical connection between the earth screen of the subsea cable and the subsea connector may be provided.

Furthermore, according to a further aspect of the present invention, a subsea penetrator arrangement for passing a subsea cable into subsea equipment is provided. The subsea penetrator arrangement comprises a housing configured to be fixed at an opening of the subsea equipment, and a subsea screen connection assembly. The subsea screen connection assembly is configured to electrically couple the subsea cable comprising an earth screen to the subsea penetrator arrangement, in particular to the housing of the subsea penetrator arrangement. The subsea screen connection assembly comprises a connector body configured to be electrically connected to the subsea penetrator arrangement, and a clamping element. The clamping element is configured to at least partially surround the earth screen of the subsea cable in a circumferential direction and to apply a clamping force in a radial direction to the at least partially surrounded earth screen of the subsea cable, the inner diameter of the clamping element being adjustable. The clamping element further comprises a coupling configured to electrically connect the earth screen of the subsea cable to the connector body. Therefore, a low resistance electrical connection between the earth screen and the subsea equipment can be realized, when the housing of the subsea penetrator arrangement is installed at the subsea equipment.

The subsea screen connection assembly of the subsea connector or the subsea penetrator arrangement may be configured as described in the various embodiments above.

Although specific features are described in the above summary and the following detailed description in connection with specific embodiments and aspects, it has to be understood that the features of the embodiments and the aspects may be combined with each other unless specifically noted otherwise.

BRIEF DESCRIPTION OF THE DRAWINGS

The present invention will now be described in more detail with reference to the accompanying drawings.

FIG. 4 shows schematically a sectional view of a subsea screen connection assembly according to an embodiment of the present invention.

FIG. 5 shows schematically a perspective view of a subsea screen connection assembly according to an embodiment of the present invention.

FIG. 6 shows schematically a perspective partial view of a subsea screen connection assembly according to an embodiment of the present invention.

FIG. 7 shows an exploded view of a subsea screen connection assembly according to an embodiment of the present invention.

DETAILED DESCRIPTION OF THE DRAWINGS

In the following, exemplary embodiments of the invention will be described in more detail. It is to be understood that the features of the various exemplary embodiments described herein may be combined with each other unless specifically noted otherwise. Same reference signs in the various drawings refer to similar or identical components.

Figure 1:
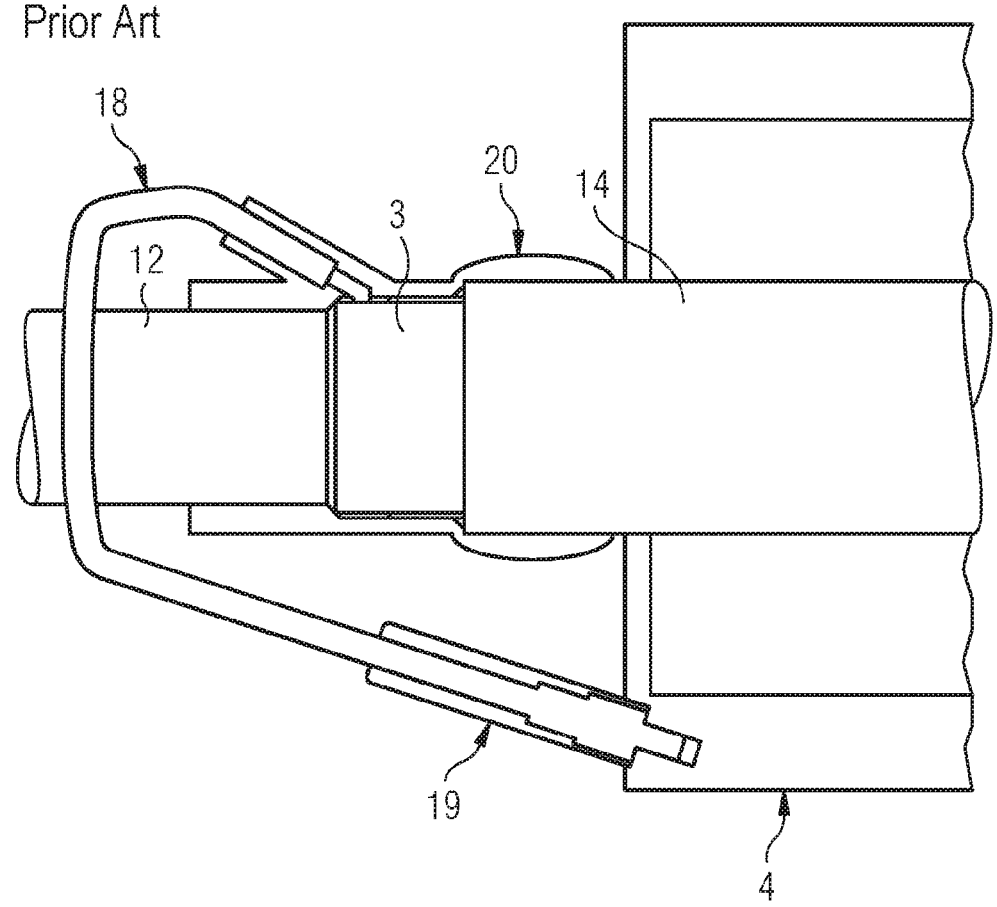
FIG. 1 shows schematically an earth screen assembly coupling an earth screen of a subsea cable via an earth wire to a connector or penetrator housing.
Figure 2:
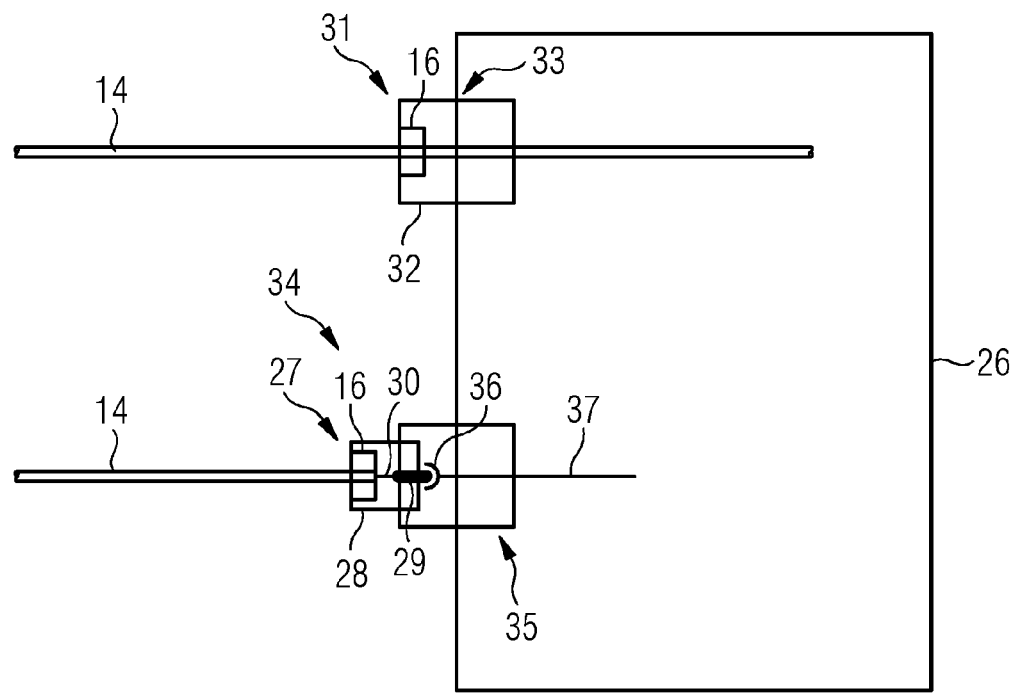
FIG. 2 shows schematically a subsea equipment comprising a subsea connector and a subsea penetrator according to embodiments of the present invention.

FIG. 2 shows a subsea equipment 26, for example, a pressure canister which may be arranged in a subsea environment for housing electrical components. For coupling the electrical components inside the subsea equipment 26 with other electrical components outside the subsea equipment 26, the subsea equipment 26 comprises a subsea connector arrangement 34 and a subsea penetrator arrangement 31.

The subsea connector arrangement 34 provides a detachable connection for coupling a subsea cable 14 to the subsea equipment 26. A first subsea connector 35 which is arranged in a wall of a housing of the subsea equipment 26 is coupled to a second subsea connector 27 which is mounted at an end of the subsea cable 14. The first subsea connector 35 comprises a first electrical contact 36 which is coupled to an internal wire 37. The internal wire 37 may be coupled to electrical components inside the subsea equipment 26. The second subsea connector 27 comprises a second electrical contact 29 which mates to the first electrical contact 36. The second electrical contact 29 is coupled within the second subsea connector 27 to a cable core or inner conductor 30 of the subsea cable 14.

Figure 3:
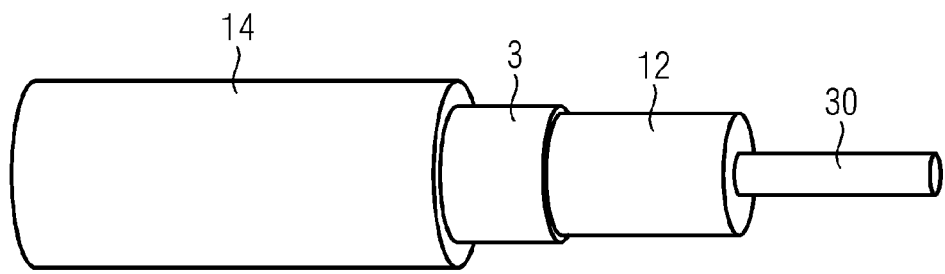
FIG. 3 shows schematically a subsea cable comprising an earth screen.

The structure of the subsea cable 14 is shown in more detail in FIG. 3. As can be seen, the cable core 30 is surrounded by a semi-conductive or isolating inner layer 12 which is surrounded by an electrically conductive earth screen 3. The earth screen 3 is surrounded by an isolating and protecting outer layer or sheath of the subsea cable 14. Although in FIG. 3 and this description only one cable core 30 is shown and described, the subsea cable 14 may comprise more than one cable core 30, for example, two or four cable cores which are embedded within the inner layer 12.

Returning to FIG. 2, the second subsea connector 27 comprises furthermore a subsea screen connection assembly 16 configured to electrically couple the earth screen 3 of the subsea cable 14 to a housing 28 of the second subsea connector 27. When the second subsea connector 27 is coupled to the first subsea connector 35, the earth screen 3 of the subsea cable 14 is electrically coupled to the housing of the subsea equipment 26 via the housing 28 and a housing of the first subsea connector 35.

The subsea penetrator arrangement 31 provides a permanent connection between the subsea cable 14 and the subsea equipment 26 by providing a sealed penetration of the subsea cable 14 into an interior of the subsea equipment 26. Inside the subsea equipment 26 the subsea cable 14 may be coupled to electrical components inside the subsea equipment 26. The subsea penetrator arrangement 31 comprises a housing 32 which is arranged in an opening 33 of the subsea equipment 26. The subsea penetrator arrangement 31 comprises further a subsea screen connection assembly 16 configured to electrically couple the earth screen 3 of the subsea cable 14 to the housing 32 of the subsea penetrator arrangement 31 and therefore also to the housing of the subsea equipment 26.

When the subsea cable 14 comprising the earth screen 3 is coupled to the subsea equipment 26, it is desired to have a reliable electrical connection with low resistance between the earth screen 3 and the housing of the subsea equipment 26. Therefore, the subsea screen connection assembly 16 which will be described in more detail below is provided at the subsea connector arrangement 34 as well as at the subsea penetrator arrangement 31.

FIG. 4 shows the subsea screen connection assembly 16 in a sectional view. The subsea screen connection assembly 16 comprises a first connector body part 6, a second connector body part 5, a collar 2 and a clamping element 1. The first and second connector body parts 6, 5 provide a receptacle 13 through which the subsea cable 14 is passing. The subsea cable 14 is configured as described above in connection with FIG. 3 and comprises an earth screen 3 which surrounds an inner layer 12 of the subsea cable 14. Within the receptacle 13 of the second connector body part 5, an outer isolating and protective layer 40, or cable sheath, of the subsea cable 14 is removed such that the earth screen 3 is exposed. The earth screen 3 is widened in its diameter such that it has three portions of different inner diameters, a first portion 23 with an inner diameter matching to the outer diameter of the inner layer 12, a second portion 24 having an inner diameter matching to an outer diameter of the collar 2, and a third portion 25 which connects the first portion 23 and the second portion 24. An inner diameter of the collar 2 is mating to an outer diameter of the inner layer 12, i.e. the inner diameter of the collar may be larger than or at least the same as the outer diameter of the inner layer 12. Therefore, the collar 2 may be arranged sandwiched between the inner layer 12 and the earth screen 3.

An inner diameter of the clamping element 1 may be adjustable by a bolt 21 as shown in FIG. 6. A washer 22 may be provided under the bolt head of the bolt 21. In an expanded state of the clamping element 1, the inner diameter of the clamping element 1 is larger than an outer diameter of the second portion 24 of the earth screen 3. Therefore, the clamping element 1 may be arranged around the second portion 24 in its expanded state. With the help of the bolt 21, the inner diameter of the clamping element 1 may be reduced such that a clamping force is applied in a radial direction from the clamping element 1 on the second portion 24 of the earth screen 3 and furthermore on the collar 2. This provides a reliable electrical contact between the earth screen 3 and the clamping element 1 via a large cross-sectional area such that a transfer resistance between the earth screen 3 and the clamping element 1 is considerably low. Arranging the collar 2 under the earth screen 3 may help to prevent a clamping force being applied to the inner layer 12.

Figure 8:
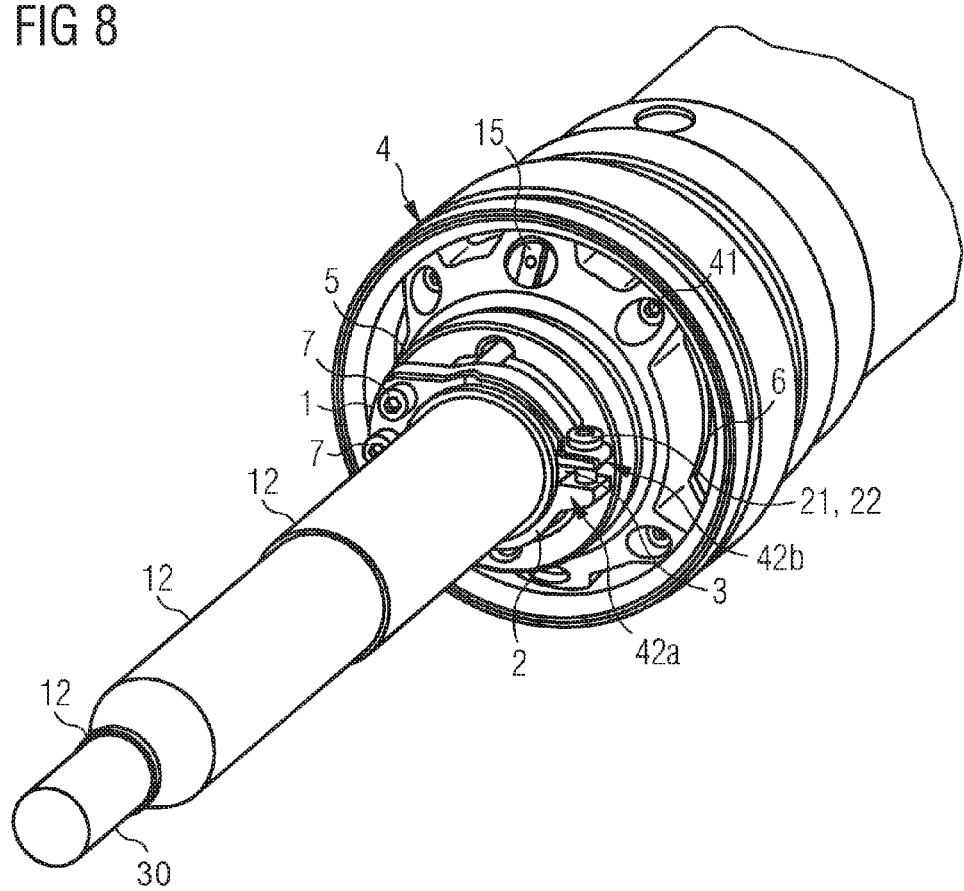
FIG. 8 shows an assembled subsea screen connection assembly according to an embodiment of the present invention.

The clamping element 1 is coupled via bolts 7 to the second connector body part 5. One or more bolts 7 may be provided, for example, two as shown in FIGS. 6 and 8. Washers 8 may be provided between bolt heads of the bolts 7 and the clamping element 1 to maintain constant pressure between the clamping element 1 and the second connector body part 5. The clamping element 1 as well as the first and second connector body parts 6, 5 may be made of an electrically conductive material, for example, a metal, for example, steel or copper. Thus, an electrical coupling with a low electrical resistance can be provided between the clamping element 1 and the second connector body part 5.

The second connector body part 5 may be coupled to the first connector body part 6 via bolts extending through bolt holes 38 as shown in FIGS. 5 and 7. Furthermore, a seal 11 may be arranged between the first and second connector body parts 6, 5. When the first and second connector body parts 6, 5 are pressed against each other, the seal 11 may be compressed and may additionally be pressed in a radial direction on the outer surface 40 of the subsea cable 14 as shown in FIG. 4. Therefore, the sealing 11 may contribute to preventing water ingress. The first connector body part 6 may be coupled to a subsea device 4, for example, a housing of a subsea connector or a subsea penetrator arrangement. Therefore, the subsea device 4 shown in FIGS. 4 and 7 may correspond, for example, to the housing 28 of the subsea connector 27 or the housing 32 of the subsea penetrator arrangement 31 of FIG. 2. A sealing between the first connector body part 6 and the subsea device 4 may be provided but is not shown in detail in FIGS. 4 and 7. To sum up, an electrical connection from the earth screen 3 of the subsea cable 14 to the subsea device 4 is provided via the clamping element 1, the second connector body part 5, and the first connector body part 6. Due to the large cross-sectional areas of the components and their contact surfaces, an electrical connection with a low resistance can be provided. It is to be noted that the first connector body part 6 and the second connector body part 5 may be formed as a single part or may comprise more than the described two parts.

For providing a sealing between the subsea cable 14 and the subsea screen connection assembly 16, the seal 11 may be provided as described above. However, the subsea screen connection assembly 16 may comprise further sealing means as will be described in the following. A boot 9 may be provided which is coupled at one end in a fluid-tight connection to the second connector body part 5 and which provides at the other end an opening 39 configured such that the inner layer 12 of the subsea cable 14 can be passed through the opening 39. Additionally, a compressing ring 17 may be provided which presses the boot 9 at least partially on an outer circumferential surface of the second connector body part 5. Thus, a chamber is formed between the seal 11 and the boot 9. The chamber includes the receptacle 13 and surrounds the clamping element 1, the collar 2, and the first, second, and third portions 23 to 25 of the earth screen 3. A filling opening 10 may be provided in the second connector body part 5 which is in fluid communication with the receptacle 13. Thus, the chamber may be filled with a flexible elastomeric encapsulant. The filling opening 10 may be closed with a plug 15. This enables the entire subsea screen connection assembly to withstand operating depth pressures of 3.000 meters and beyond. The flexible nature of the encapsulant allows the assembly to assume depth pressure without the need to withstand any differential pressures. This is achieved in that the elastomeric boot 9 and the seal 11 transfer pressure to the encapsulant.

Furthermore, the subsea screen connection assembly 16 provides additional support to the subsea cable 14 within the subsea device 4. The collar 2, the clamping element 1, and the first connector body part 6 may be configurable to match different subsea cable diameters and earth screen cross-sectional area sizes.

FIG. 8 illustrates the assembled subsea connection assembly. The boot 9, seal 11 and compression ring 17 are omitted for clarity. The conductor 13 is surrounded by the inner layer 12, which may be made of one or more individual layers, in this example three are illustrated. The collar 2 is located around a section of the the inner layer 12 and the earth screen 3 is clamped between the collar 2 and the clamping element 1. The collar 2 is designed to withstand the compressive force of the clamping element, so that the cable inner layer 12 is not damaged. Bolt 21 and washer 22 allow the inner diameter of the clamping element 1 to be varied according to the extent to which the bolt forces the opposing clamping element ends 42a, 42b together. The clamping element is coupled to the second connector body part 5 by a coupling, shown in this example as one or more bolts 7. Bolts 41 connect the second connector body part 5 and the first connector body part 6 to the subsea device 4, with the first connector body part 5 being held firmly between the second connector body part 6 and the subsea device 4. Plug 15 closes the filing opening.

The invention claimed is:

1. A subsea screen connection assembly configured to electrically couple a subsea cable comprising an earth screen, the earth screen at least partially surrounding a cable core, to a subsea device, the subsea screen connection assembly comprising:
    a connector body configured to be electrically connected to the subsea device, and
    a clamping element configured to at least partially surround the earth screen of the subsea cable in a circumferential direction and to apply a clamping force in a radial direction to the at least partially surrounded earth screen of the subsea cable, an inner diameter of the clamping element being adjustable, and wherein the clamping element further comprises a coupling configured to electrically connect the earth screen to the connector body,
    wherein the earth screen terminates at the clamping element.

2. The subsea screen connection assembly according to claim 1, further comprising
    a collar,
    wherein an inner circumferential surface of the collar is configured such that the inner circumferential surface mates to an outer circumferential surface of an inner layer of the subsea cable, the inner layer of the subsea cable being surrounded by the earth screen of the subsea cable and surrounding the cable core.

3. The subsea screen connection assembly according to claim 2,
    wherein the collar is located between the earth screen of the subsea cable and the inner layer of the subsea cable, and is at least partially surrounded by the clamping element, wherein the clamping element applies the clamping force in the radial direction to the earth screen and the collar.

4. The subsea screen connection assembly according to claim 2,
    wherein the earth screen comprises a first portion having a first inner diameter mating to an outer diameter of the inner layer of the subsea cable, a second portion having a second inner diameter larger than the first inner diameter and mating to an outer diameter of the collar, and a third portion connecting the first and second portions.

5. The subsea screen connection assembly according to claim 4,
    wherein the clamping element applies radial force onto the second portion, the second portion forwarding the force to the collar.

6. The subsea screen connection assembly according claim 1,
    wherein the connector body comprises a receptacle through which the subsea cable is passed to enter the subsea device, wherein the connector body includes a filling opening in a fluid communication with the receptacle for filling an elastomeric encapsulant into the receptacle for sealing the subsea cable within the receptacle.

7. The subsea screen connection assembly according to claim 6,
    wherein the connector body comprises a seal arranged at an inner circumferential surface of the receptacle, the seal being configured to provide a sealing between the connector body and an outer circumferential surface of the subsea cable.

8. The subsea screen connection assembly according to claim 7,
    wherein the connector body is composed of at least a first connector body part and a second connector body part, wherein the seal is arranged between the first connector body part and the second connector body part.

9. The subsea screen connection assembly according to claim 8,
    wherein the first connector body part is configured to be coupled to the subsea device and the second connector body part is coupled to the clamping element.

10. The subsea screen connection assembly according to claim 7, further comprising
    a boot coupled in a fluid tight connection to the connector body,
    wherein the boot has an opening configured such that the subsea cable can be passed through the opening;
    wherein an interior of the boot is in fluid communication to the receptacle, wherein the seal and the boot are configured to communicate an external pressure to the elastomeric encapsulant within the subsea screen connection assembly creating a pressure balanced system.

11. The subsea screen connection assembly according to claim 1, further comprising
    a boot coupled in a fluid tight connection to the connector body,
    wherein the boot has an opening configured such that the subsea cable can be passed through the opening.

12. The subsea screen connection assembly according to claim 11, further comprising
    a compressing ring which presses the boot at least partially on the connector body.

13. The subsea screen connection assembly according to claim 1,
    wherein the connector body and the clamping element are made at least partially of an electrically conductive material.

14. The subsea screen connection assembly according to claim 1,
    wherein the coupling comprises a bolt,
    wherein the clamping element is coupled to the connector body via the bolt.

15. The subsea screen connection assembly according to claim 14, further comprising
    a washer,
    wherein the washer is arranged between the clamping element and a bolt head of the bolt.

16. A subsea connector for electrically coupling a subsea cable to subsea equipment, the subsea connector comprising:
- a housing,
- an electrical contact configured to be coupled to a cable core of the subsea cable, and
- a subsea screen connection assembly configured to electrically couple an earth screen of the subsea cable to the housing, the subsea screen connection assembly comprising:
  - a connector body configured to be electrically connected to the housing, and
  - a clamping element configured to at least partially surround the earth screen of the subsea cable in a circumferential direction and to apply a clamping force in a radial direction to the at least partially surrounded earth screen of the subsea cable, an inner diameter of the clamping element being adjustable, wherein the clamping element further comprises a coupling configured to electrically connect the clamping element to the connector body,
- wherein the earth screen terminates at the clamping element.

17. A subsea screen connection assembly configured to electrically couple a subsea cable comprising an earth screen, the earth screen at least partially surrounding a cable core, to a subsea device, the subsea screen connection assembly comprising:
- a connector body configured to be electrically connected to the subsea device, and
- a clamping element configured to at least partially surround the earth screen of the subsea cable in a circumferential direction and to apply a clamping force in a radial direction to the at least partially surrounded earth screen of the subsea cable, an inner diameter of the clamping element being adjustable, and wherein the clamping element further comprises a coupling configured to electrically connect the earth screen to the connector body,
- wherein the connector body comprises a receptacle through which the subsea cable is passed to enter the subsea device, wherein the connector body includes a filling opening in a fluid communication with the receptacle for filling an elastomeric encapsulant into the receptacle for sealing the subsea cable within the receptacle
- wherein the connector body comprises a seal arranged at an inner circumferential surface of the receptacle, the seal being configured to provide a sealing between the connector body and an outer circumferential surface of the subsea cable
- wherein the subsea screen connection assembly further comprises a boot coupled in a fluid tight connection to the connector body, wherein the boot has an opening configured such that the subsea cable can be passed through the opening, and wherein an interior of the boot is in fluid communication to the receptacle, and wherein the seal and the boot are configured to communicate an external pressure to the elastomeric encapsulant within the subsea screen connection assembly creating a pressure balanced system.

\* \* \* \* \*